United States Patent [19]
Samulewicz

[11] Patent Number: 5,479,163
[45] Date of Patent: Dec. 26, 1995

[54] CIRCULAR TACTILE KEYPAD

[76] Inventor: Thomas Samulewicz, 1828 Polo Run Drive, Yardley, Pa 19067

[21] Appl. No.: 285,431

[22] Filed: Aug. 4, 1994

[51] Int. Cl.$^6$ ................................... H03K 17/94
[52] U.S. Cl. ................ 341/22; 341/20; 341/21; 341/22; 400/489
[58] Field of Search ............... 341/20–22, 176; 264/709.12; 240/825.19; 273/148 B; 345/168; 400/472, 489, 48

[56] References Cited

U.S. PATENT DOCUMENTS

| | | | |
|---|---|---|---|
| 3,754,495 | 8/1973 | Honegger | 84/471 |
| 4,458,238 | 7/1984 | Learn | 341/20 |
| 5,274,693 | 12/1993 | Waldman | 379/59 |

Primary Examiner—John K. Peng
Assistant Examiner—Ashok Mannava
Attorney, Agent, or Firm—Gregory J. Gore

[57] ABSTRACT

A digital keypad for a controller of an electrical device includes keys which are circularly arranged in a clock face pattern. The keys are marked with numeric indicia in sequential numeric order from 1 to 12, each switch being radially spaced 30-degrees apart. Some of the numbered keys may be replaced with other symbols as desired. Tactile key-finding ridges emanate from the center of the circular key pattern, extending in the direction of each key. The keypad may be releaseably affixed to a trigger grip stand, comprising a planar base and a vertical handle having a trigger switch which when depressed transmits preselected signals to the electrical device.

15 Claims, 3 Drawing Sheets

CIRCULAR TACTILE KEYPAD

FIELD OF THE INVENTION

The present invention relates to a keypad for digital controllers to operate electrical devices. More specifically, it relates to keypads having tactile elements which aid the operator in locating different keys on the keypad.

BACKGROUND OF THE INVENTION AND DESCRIPTION OF PRIOR ART

Digital keypads are commonly used to control many different types of electrical devices, including household appliances, televisions, telephones, etc. Controller keypads are marked with numeric indicia and are typically arranged in a rectangular format with individual key-actuated switches located in a rectangular grid pattern beneath the keys. Individual keys may be raised above the face of the keypad so that the operator can locate an individual key by his sense of touch. Membrane-type switches placed underneath the surface of the keypad face are commonly used. In order to help the operator locate individual keys, it is also known to have the keypads lighted to compensate for low-light conditions during operation. It is also known to employ a plurality of push-buttons around the circumference of a circle on a telephone in order to combine o the features of push-button dialing with the format of an older style rotary telephone dialer. These buttons are not located in the numeric orientation or the radial spacing of a traditional clock face. The closest patent art of which the applicant is aware is U.S. Pat. No. 5,253,068 issued to Crook et al, entitled "Gun Shaped Remote Control Unit for a Television". While this patent shows the use of a pistol-shaped remote controller having a trigger switch which produces a signal beam from a TV remote keypad, it fails to disclose the stand structure or the unique keypad configuration of the present invention that will be further described herein.

The above prior art however, does not meet the needs of a manually handicapped or visually-impaired person who requires a digital keypad that is easy to use and sometimes requires its use without the benefit of sight in low-light conditions.

SUMMARY OF THE INVENTION

In order to meet the needs described above, the present keypad controller has been devised which permits ease of use by persons who are manually impaired, or who have eyesight deficiency. It also offers the advantage of ease of use in conditions of low light by a person having normal vision.

In one embodiment, these advantages are provided by a keypad which is held in an elevated position by a stand. The stand includes a planar base and a vertical handle having a trigger switch. The handle and trigger switch are easily gripped. When depressed, the trigger switch transmits signals to the electrical device. In this configuration, the keypad of the present invention is particularly suited to aid the manually impaired as a TV remote controller for channel selection and other functions. The keypad is also conveniently detachable from the stand so that the controller unit is smaller and more practical. Other advantages of the stand include: allowing the unit to rest in an upright position when not in use; making it is less likely to become lost; allowing the operator to conveniently point the unit at the TV to transmit; and permitting two-handed operation by which the stand is grasped in one hand, while the keypad is operated by the other hand.

While the above description shows the keypad of the present invention applied to a remote-type controller, it may also be used as a keypad which is affixed directly to an appliance which it controls and in such applications would of course not be a separate unit detachable from a stand. It should be further understood that the gist of the invention is the construction of the keypad, the controller and stand apparatus. Other internal features, such as signal transmission means between the remote controller and the appliance like an infrared light beam and a light receptor on the appliance form no part of the present invention. Details of these internal features are omitted from the present description as they will be readily understood by one of ordinary skill in the art to be easily employed with the features of the present invention described herein.

Regardless of application, the digital keypad of the present invention contains the unique feature of numeric keys located in the circular pattern of a traditional clock face. In one embodiment, the indicia of the individual key switches located on the face of the keypad are marked with numeric indicia located about the diameter of a circle, arranged in sequential numerical order from the number "1" to the number "12", each switch being radially spaced 30-degrees apart. Because the user has the mental familiarity with the numeric positions on a traditional circular clock face, it is very easy to locate a key switch of a particular numeric value simply by locating its angular orientation along the circular pattern of the key switches.

Finding the location of the switches may be further enhanced by the addition of tactile key-finding ridges which emanate like spokes on a wheel from the center of the circular key pattern. The key switch marked with the indicia "12" is preferably located at the top of the keypad farthest from the operator. To find a key switch, the user may simply locate a ridge which corresponds to the angular position of the desired numeric key associated with the same numeric position on the clock face dial and then move his finger along the length of the ridge to its extremity where the correct key is found. As an additional advantage, quadrant keys spaced 90-degrees apart may be raised above the height of the other keys so that the angular positions of the numeric values "12", "3", "6", and "9" of the traditional clock face may be more easily located tactically. Thus, each key located at the extremity of each ridge can be easily found, even by the unsighted.

If a complete circular format is employed, there will be a total of twelve ridges with twelve corresponding indicia. These may be marked in sequential numeric order from the number "1" to the number "12" as is a traditional clock face. Alternatively, if the present device is to be used as a telephone dialer, the indicia "10", "11", and "12" may be replaced with the indicia "0", "*", "#" respectively, found on telephone keypads. In the preferred embodiment, all of said ridges are wedge-shaped, being highest at one end toward the center of the circle and convergent with the face of the keypad in the direction of the switches at the other end. Another position on the keypad that can easily be located using the ridges is the center of the keypad. At this location, a center key switch may be placed which can function as the "0" key.

The present invention may be more specifically described as a digital keypad, comprising: a controller for an electrical device; a keypad on the controller having a plurality of manually-operated key switches marked with numeric or symbolic indicia. The switches located about the diameter of a circle are marked in sequential numerical order and are radially spaced 30-degrees apart. The keypad may be detachably affixed to a trigger grip stand, comprising a planar base and a vertical handle having a trigger switch which when depressed transmits signals to the electrical device. The keypad may further include a plurality of fixed ridges raised above the face of the keypad, each ridge being elongate and located along a radius from the center of the circle to one of the switches. Some of the ridges are quadrant ridges being spaced 90-degrees apart and raised higher from the face of the keypad than the other ridges. All of the ridges are wedge-shaped and being highest at one end toward the center of the circle and convergent with the face of the keypad in the direction of the switches at the other end of the ridge. Preferably, the quadrant ridges are in alignment with the switches marked with the indicia "3", "6", "9" and "12". The keypad may further include a center key switch located at the center of the circle and all key switches may be membrane-type switches.

Objects, advantages and novel features of the invention will become apparent from the following detailed description of the invention when considered in conjunction with the accompanying drawings.

DESCRIPTION OF THE PREFERRED EMBODIMENT

Figure 1:
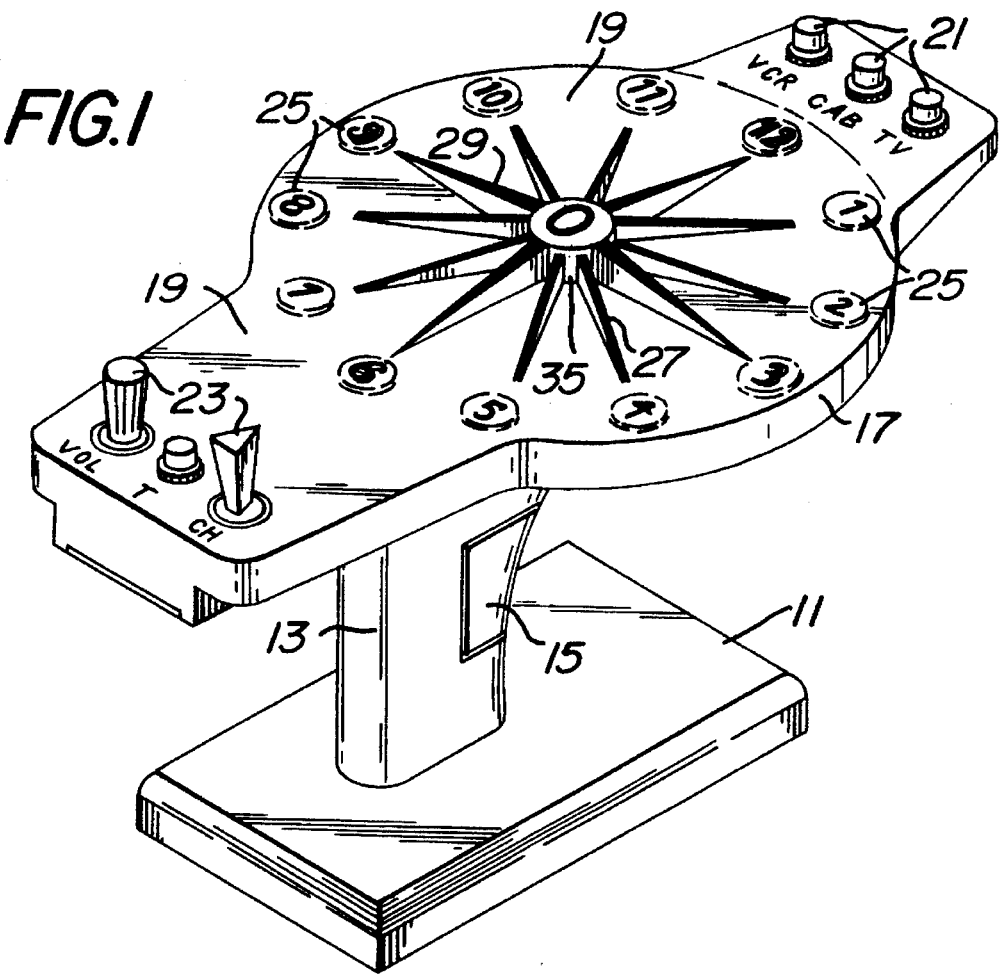
FIG. 1 is a top right rear isometric view of the present invention.

Referring now to FIG. 1, a stand-mounted use of the present invention is depicted. Controller module 17 is supported by a trigger-grip stand which includes a planar base 11 with attached handle 13. The controller module includes a keypad face 19 on which a plurality of key switches 25 are arranged. The controller also includes other electrical switching devices 21 and 23 which may control other functions of the electrical device with which it is associated. In this embodiment, the invention is employed in the form of a remote TV controller and the key switches provide channel selection. This controller may be of the type which includes an infrared light transmitter well-known in the controller arts, which is not shown in this figure nor which forms a part of the present invention. Used as a TV remote controller, the stand which includes handle 13 may also include a front facing trigger switch 15 that is electrically connected to the controller to perform the "transmit" function to signal the TV. In this embodiment, indicia marked with the numerals "1" through "12" are spaced 30-degrees apart in a circular format which replicates traditional clock face numbering. In the preferred embodiment, the indicia indicate the position of membrane-type push switches well-known in electrical arts which are placed just beneath the surface of the keypad face. An additional center key switch 35 is preferably located at the center of the circular array of switches. Tactile switch locating ridges 27 originate at the central push-button and are formed as raised elongate projections which travel radially outward to each key switch. Quadrant ridges 29, each spaced apart 90-degrees, are directed to the switches marked with the numeric indicia "12", "3", "6", and "9" with "12" at the top and "6" at the bottom. The quadrant ridges which are raised higher than the other ridges are tactily discernible and function as reference points for the other ridges.

Figure 2:
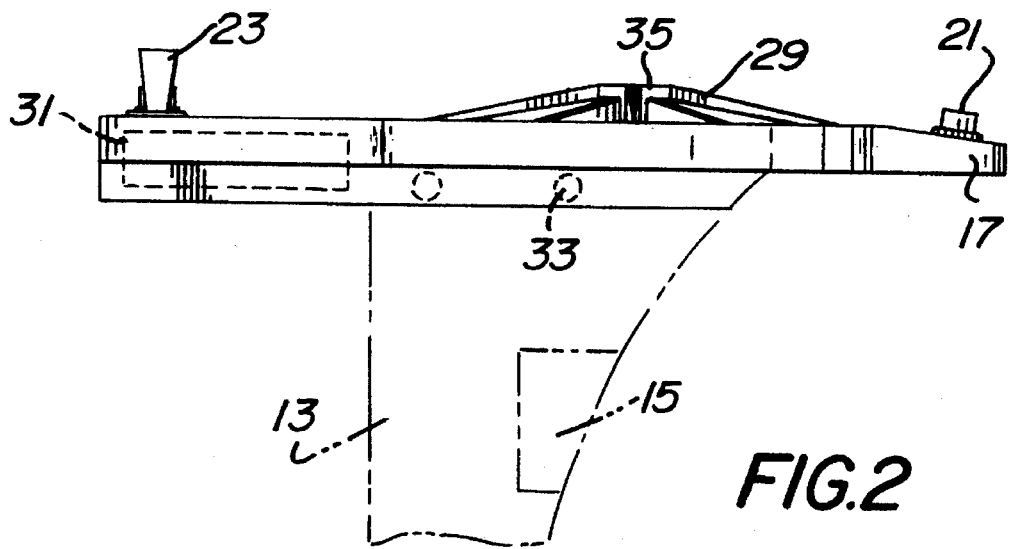
FIG. 2 is a left side view of the present invention with the battery and the elements of the detachable handle shown in phantom.

Referring now to FIG. 2, the side view of the apparatus of FIG. 1 is shown. As shown in this figure, ridges 29 are wedge-shaped with their greatest height at the center of the circular switch layout and are convergent with the surface of the keypad at their radial extremities. The controller of the present invention includes its own battery power supply 31. Contact pins 33, which are more clearly shown in FIG. 3, operate as mechanical detent fasteners for snap-on attachment to handle 13, which in this figure is shown in phantom. As mentioned above, the handle may include trigger switch 15. The trigger switch is electrically connected to the controller 17 through the pins 33 which are electrically conductive.

Figure 3:
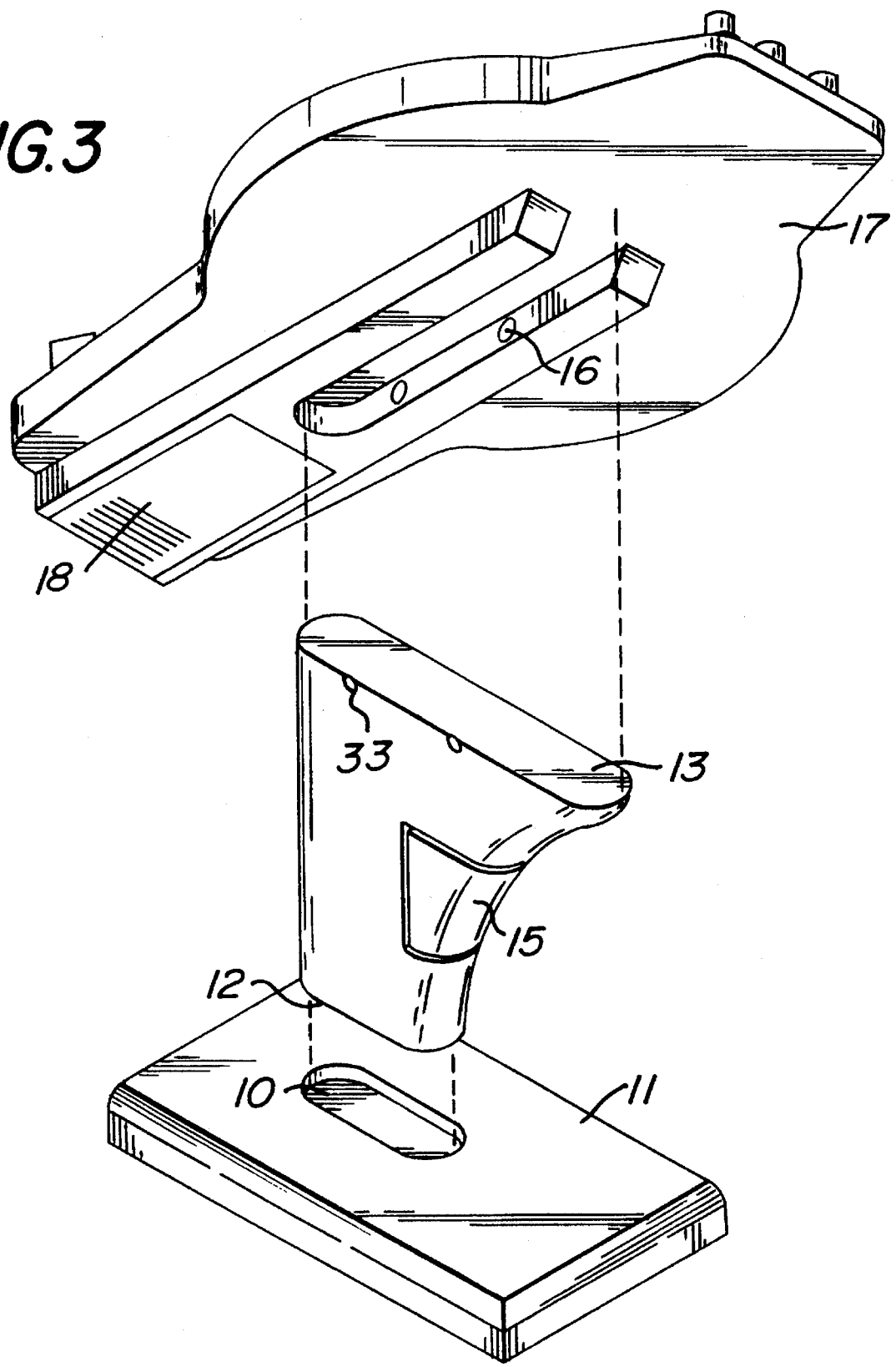
FIG. 3 is a front isometric exploded view of the present invention showing the detachability of the modular keypad.

Referring now to FIG. 3, the underside of controller 17 is shown with means for detachment from the handle 13 or stand 11. Detent pins 33 fit into recesses 16, all of which may be electrically conductive so that trigger switch means 15 are electrically connected to the controller. Trigger switch 15 may be used to transmit the electrical signal from the controller to the associated electrical device and is preferably used to initiate the selected function, operating as a typical "enter" key. Stand 11 may also be detachable from handle 13 which may be affixed thereto by simple force-fit of the bottom end of the handle 12 into base aperture 10. Batteries may be accessed through removable panel 18.

Figure 4:
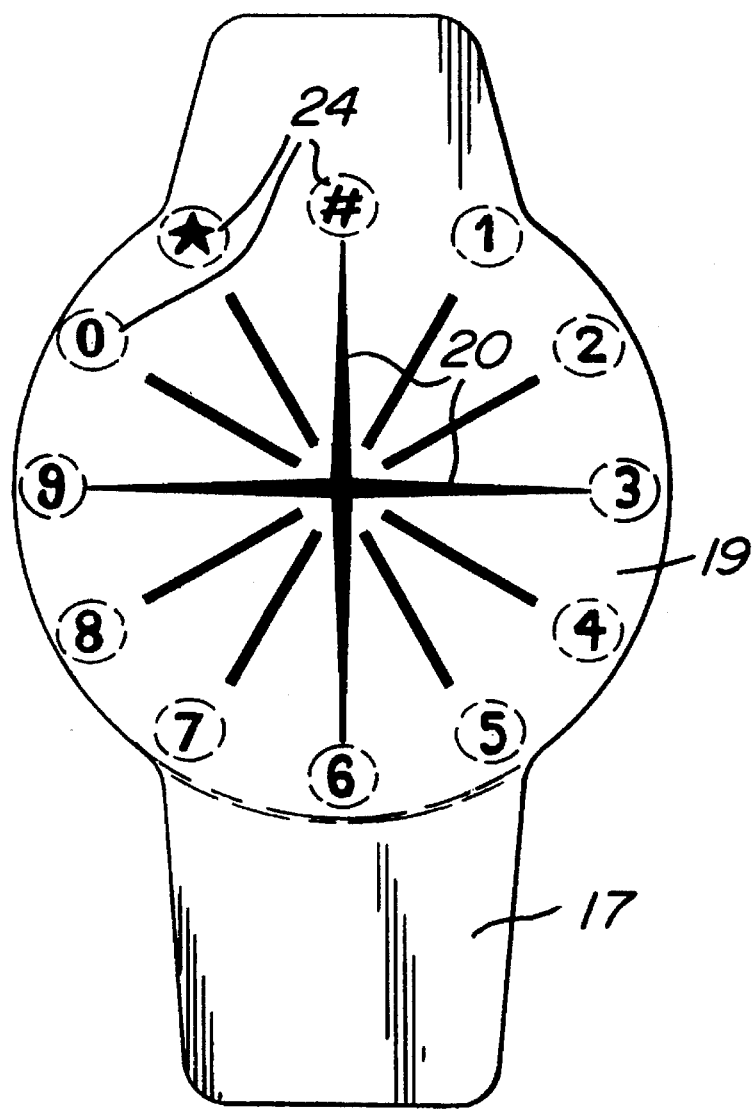
FIG. 4 is a top view of a keypad of an embodiment showing alternative key switch markings.

Referring now to FIG. 4, the top view of controller 17 is shown in an embodiment for use as a telephone dialer. In this embodiment, the center button has been eliminated and the numerically marked switches "10", "11" and "12" shown in the embodiment of FIG. 1 have been replaced with indicia 24, namely, "0", "*" and "#". Again, quadrant ridges 20 are also enlarged and raised to a greater height than the other ridges, all of which project from the keypad face 19 as in the embodiment shown in FIG. 1. This embodiment provides a fully functional telephone dialer.

The clock face-like circular layout of the key switches is a critical feature of the present invention. This layout is particularly effective in enabling the user to quickly locate each marked switch because the clock face-type numeric configuration has universal cognitive familiarity. With the addition of the above-described ridges, the keypad of the present invention can be used easily even by the blind or in darkness by users who are normally sighted. The invention is also particularly suited to users who are manually impaired, because the stand and handle structure permit convenient two-handed grasping of the controller which may otherwise be difficult to manipulate. Also, the pistol grip type construction facilitates pointing the controller signal at the target appliance, such as a TV.

It should be understood that the above description discloses specific embodiments of the present invention and are for purposes of illustration only. There may be other modifications and changes obvious to those of ordinary skill in the art which fall within the scope of the present invention which should be limited only by the following claims and their legal equivalents.

What is claimed is:

1. A digital keypad, comprising:

a controller for signalling an electrical device;

a keypad on said controller;

a plurality of manually-operated key switches on a face of said keypad, said switches including switches marked with indicia 1–9 located about the circumference of a circle in clock-face arrangement, being radially spaced 30-degrees apart, and having the indicia "6" at the bottom of said circle; and a plurality of fixed ridges on the face of said keypad, each ridge being elongate and located along a radius from the center of said circle to one of said switches.

2. The keypad of claim 1, wherein said keypad is detachably affixed to a trigger grip stand.

3. The keypad of claim 2, wherein said stand comprises a planar base and a vertical handle having a trigger switch, which when depressed, transmits signals to said electrical device.

4. The keypad of claim 3, wherein said keypad is attached to a top of the handle.

5. The keypad of claim 1, wherein some of said ridges are quadrant ridges being spaced 90-degrees apart which are raised higher from the face of said keypad than the other of said ridges.

6. The keypad of claim 5, wherein all of said ridges are wedge-shaped, being highest at one end toward the center of said circle and convergent with the face of said keypad in the direction of said switches at an opposite end.

7. The keypad of claim 6, wherein one of said quadrant ridges is in alignment with a switch marked with the indicia "3".

8. The keypad of claim 7, wherein said switches are membrane-type push switches.

9. The keypad of claim 1, further described in that said switches comprise thirteen key switches representing the numbers 0–12 with key switches representing the numbers 1–12 located about said circle and including a switch marked with the indicia "12" located at the top of the keypad, farthest from the operator.

10. The keypad of claim 6, further including a center key switch on said keypad located at the center of said circle.

11. The keypad of claim 10, wherein the top of said center key switch is flush with a highest point of said ridges.

12. The keypad of claim 1, wherein said switches are coded with numeric indicia from "1" through the number "9", and following the switch coded "9" are, in order marked with the indicia "0", "*" and "#".

13. The keypad of claim 12, wherein said keypad is a telephone dialer.

14. The keypad of claim 3, wherein said keypad is a TV remote controller.

15. A digital keypad, comprising;

a controller for signalling an electrical device:

a keypad on said controller;

a plurality of manually-operated key switches on a face of said keypad, said switches including switches located about the circumference of a circle being radially spaced 30-degrees apart; and a plurality of fixed ridges on the face of said keypad, each ridge being elongate and located along a radius from the center of said circle to one of said switches.

* * * * *